United States Patent
Lee et al.

(10) Patent No.: US 9,698,319 B2
(45) Date of Patent: Jul. 4, 2017

(54) LED PACKAGE WITH LEAD TERMINALS HAVING PROTRUSIONS OF DIFFERING WIDTHS AND METHOD FOR FABRICATING THE SAME

(71) Applicant: Seoul Semiconductor Co., Ltd., Ansan-si (KR)

(72) Inventors: Chung Hoon Lee, Ansan-si (KR); Yoon Hee Kim, Ansan-si (KR); Byung Yeol Park, Ansan-si (KR); Bang Hyun Kim, Ansan-si (KR); Eun Jung Seo, Ansan-si (KR); Hyouk Won Kwon, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 0 days.

(21) Appl. No.: 14/142,071

(22) Filed: Dec. 27, 2013

(65) Prior Publication Data
US 2014/0110739 A1    Apr. 24, 2014

Related U.S. Application Data

(63) Continuation of application No. 12/746,447, filed as application No. PCT/KR2008/007103 on Dec. 2, 2008, now abandoned.

(30) Foreign Application Priority Data

Dec. 6, 2007  (KR) .................. 10-2007-0126436

(51) Int. Cl.
*H01L 33/00*   (2010.01)
*H01L 33/54*   (2010.01)
(Continued)

(52) U.S. Cl.
CPC .......... *H01L 33/54* (2013.01); *H01L 33/486* (2013.01); *H01L 33/60* (2013.01); *H01L 33/62* (2013.01);
(Continued)

(58) Field of Classification Search
CPC ..... H01L 33/62; H01L 33/642; H01L 33/647; H01L 23/49541; H01L 23/49565
(Continued)

(56) References Cited

U.S. PATENT DOCUMENTS 5,990,497 A * 11/1999 Kamakura ............ H01L 33/486
                                                     257/100
6,355,946 B1 * 3/2002 Ishinaga ........................ 257/98
(Continued)

FOREIGN PATENT DOCUMENTS

EP           1801893        6/2007
JP        2000-049383       2/2000
(Continued)

OTHER PUBLICATIONS

Non-Final Office Action issued on Nov. 6, 2012 in U.S. Appl. No. 12/746,447.
(Continued)

*Primary Examiner* — Jesse Y Miyoshi
(74) *Attorney, Agent, or Firm* — H.C. Park & Associates, PLC

(57) ABSTRACT

A light emitting diode (LED) package according to an exemplary embodiment of the present invention includes a base including a first lead terminal and a second lead terminal, an LED chip disposed on the base, a housing disposed on the base, the housing having a cavity in which the LED chip is disposed, and an encapsulation member having a side surface contacting the housing. The first lead terminal and the second lead terminal each have a first (Continued)

surface and a second surface opposite the first surface, and have an unbent form, respectively. The second surface is exposed to the outside of the LED package.

14 Claims, 9 Drawing Sheets

(51) Int. Cl.
  *H01L 33/62* (2010.01)
  *H01L 33/64* (2010.01)
  *H01L 33/48* (2010.01)
  *H01L 33/60* (2010.01)

(52) U.S. Cl.
  CPC .......... *H01L 33/641* (2013.01); *H01L 33/642* (2013.01); *H01L 33/647* (2013.01); *H01L 2224/48091* (2013.01); *H01L 2224/48247* (2013.01); *H01L 2224/48465* (2013.01); *H01L 2933/005* (2013.01); *H01L 2933/0091* (2013.01)

(58) Field of Classification Search
  USPC ............................... 257/81, 98, 99, 100, 676
  See application file for complete search history.

(56) References Cited

U.S. PATENT DOCUMENTS

| | | | | |
|---|---|---|---|---|
| 6,841,934 | B2* | 1/2005 | Wang et al. | 313/512 |
| D563,333 | S * | 3/2008 | Kim et al. | D13/180 |
| 7,932,525 | B2 | 4/2011 | Osamu | |
| 2003/0107316 | A1 | 6/2003 | Murakami et al. | |
| 2003/0178691 | A1* | 9/2003 | Wang | H01L 33/486 |
| | | | | 257/431 |
| 2004/0164675 | A1* | 8/2004 | Wang | H01L 33/505 |
| | | | | 313/512 |
| 2005/0093005 | A1 | 5/2005 | Ruhnau et al. | |
| 2005/0139855 | A1* | 6/2005 | Wang et al. | 257/100 |
| 2005/0236639 | A1 | 10/2005 | Abe et al. | |
| 2005/0245018 | A1 | 11/2005 | Bogner et al. | |
| 2005/0280017 | A1* | 12/2005 | Oshio | H01L 33/647 |
| | | | | 257/99 |
| 2006/0043407 | A1 | 3/2006 | Okazaki | |
| 2006/0261360 | A1 | 11/2006 | Takehashi et al. | |
| 2006/0261366 | A1 | 11/2006 | Yang | |
| 2007/0034886 | A1 | 2/2007 | Wong et al. | |
| 2007/0075451 | A1* | 4/2007 | Winter | B22F 3/225 |
| | | | | 264/126 |
| 2007/0170454 | A1 | 7/2007 | Andrews | |
| 2007/0215896 | A1 | 9/2007 | Sun et al. | |
| 2007/0247841 | A1* | 10/2007 | Kono et al. | 362/227 |
| 2007/0262336 | A1 | 11/2007 | Tamaki et al. | |
| 2008/0210965 | A1* | 9/2008 | Hung | H01L 33/56 |
| | | | | 257/98 |
| 2008/0268559 | A1 | 10/2008 | Jung | |

FOREIGN PATENT DOCUMENTS

| | | |
|---|---|---|
| JP | 2002-094124 | 3/2002 |
| JP | 2004-158557 | 6/2004 |
| JP | 2004-274027 | 9/2004 |
| JP | 2004-296882 | 10/2004 |
| JP | 2005-259972 | 9/2005 |
| JP | 2005-353914 | 12/2005 |
| JP | 2006-093672 | 4/2006 |
| JP | 2006-156704 | 6/2006 |
| JP | 2006-303397 | 11/2006 |
| JP | 2006-324623 | 11/2006 |
| JP | 2007-049167 | 2/2007 |
| JP | 2007-288198 | 11/2007 |
| KR | 1998-025874 | 7/1998 |
| KR | 10-2005-0071780 | 7/2005 |
| KR | 10-2007-0000638 | 1/2007 |
| TW | 472370 | 1/2002 |
| TW | I238547 | 8/2005 |
| WO | 2007/007959 | 1/2007 |

OTHER PUBLICATIONS

Final Office Action issued on Apr. 23, 2013 in U.S. Appl. No. 12/746,447.
European Search Report issued on Mar. 5, 2012 in European Patent Application No. 08857114.6.
Taiwanese Office Action issued on Feb. 23, 2013 in Taiwanese Patent Application No. 097147391.
Non-Final office Action issued on Apr. 16, 2014 in U.S. Appl. No. 12/746,447.
Office Action issued on Nov. 28, 2014, in European Application No. 08 857 114.6.
Final Office Action issued Sep. 22, 2014, in U.S. Appl. No. 12/746,447.
Final Office Action issued on Mar. 1, 2016, in U.S. Appl. No. 14/318,125.
Final Office Action dated Dec. 20, 2016, in U.S. Appl. No. 14/318,125.
Non Final Office Action dated Apr. 3, 2017, in U.S. Appl. No. 14/318,125.

* cited by examiner (a)

(b)

(a)

(b)

(c)

(a)

(b)

(a)

(b)

(c)

LED PACKAGE WITH LEAD TERMINALS HAVING PROTRUSIONS OF DIFFERING WIDTHS AND METHOD FOR FABRICATING THE SAME

CROSS-REFERENCE TO RELATED APPLICATIONS

This application is a continuation of U.S. patent application Ser. No. 12/746,447, filed on Oct. 15, 2010, which is the national stage entry of International Application No. PCT/KR2008/007103, filed Dec. 2, 2008, and claims priority from and the benefit of Korean Patent Application No. 10-2007-0126436, filed on Dec. 6, 2007, which are hereby incorporated by reference for all purposes as if fully set forth herein.

BACKGROUND OF THE INVENTION

Field of the Invention

The present invention relates to a light emitting diode (LED) package and a method of fabricating the same, and more particularly, to an improvement of an LED package, which includes a light-transmittable encapsulation member for encapsulating an LED chip and a housing configured to surround the encapsulation member.

Discussion of the Background

An LED is a semiconductor light emitting device in which a current is supplied thereto and electrons and holes may be recombined in p-n semiconductor junctions to emit light. Conventionally, the LED is fabricated as a package structure including an LED chip, and the light emitting device configured as described above may be generally referred to as an "LED package."

Generally, the LED package includes a base which is mounted with the LED chip and is provided with electric terminals, and a light-transmittable encapsulation member which is configured to protect the LED chip. A lead frame or a printed circuit board (PCB) has been prevailingly used as the base which is mounted with the LED chip. Depending on what is used as the base, the LED package may also be classified into a lead frame type LED package and a PCB type LED package. Further, an additional component such as a heat sink may also be used as the base which is mounted with the LED chip.

The lead frame type LED package includes a housing for defining a cavity in which the encapsulation member is formed. Such a housing generally serves to reflect light in order to narrow a viewing angle, i.e., in order to collect light, so that the housing has been referred to as a reflector. In the LED package as described above, the housing is formed of an opaque resin material by an ejection molding process and then a liquefied light-transmittable resin is injected into the cavity of the housing in a dotting manner to thereby form the encapsulation member.

It is conventionally difficult to design and fabricate the LED package with a viewing angle of light variably changed. This is because the design for the light viewing angle of the housing primarily depends on the shape for the reflection surface of the housing (in particular, the angle for the reflection surface). Further, since there is a large difference between the molding method of the housing and the molding method of the encapsulation member, it is difficult to consecutively fabricate the LED package and the fabrication process for the LED package is cumbersome and complicated.

According to the technique in which a liquefied resin is injected into the cavity of the ejection-molded housing in a dotting manner to form the encapsulation member, the encapsulation member is configured to have an undesired, upwardly convex shape due to the surface tension exerted on the liquefied resin. The shape of the encapsulation member deteriorates various performances of the LED package in the optical aspect. For example, if the LED package fabricated as described above is employed in a back light, the convex portion of the encapsulation member faces a light guide plate, thereby generating a hot spot phenomenon, i.e., a phenomenon in which there exists a point-shaped region excessively brighter than other regions. At this time, it is noted that such a convex shape of the encapsulation member as described above is different from that of the convex lens that is designed as required to control the viewing angle of light. On the other hand, if the amount of the liquefied resin injected into the cavity is reduced, there is generated an undesired, concave shape to thereby decrease the light emitting efficiency of the LED package.

SUMMARY OF THE INVENTION

Accordingly, an object of the present invention is to provide an LED package and a method for fabricating the same, in which an encapsulation member for encapsulating an LED chip within a housing is easily designed to have a shape as required.

Another object of the present invention is to provide an LED package and a method for fabricating the same, in which a housing is formed of a light-transmittable material which may control the transparency and the viewing angle, so that controlling the transparency of the housing may enlarge a design range for the viewing angle of light.

A further object of the present invention is to provide an LED package and a method for fabricating the same, in which a housing is formed by a method which is identical to or similar with a process for forming an encapsulation member, thereby being capable of fabricating the LED package in a consecutive and simple manner.

An LED package according to an aspect of the present invention comprises a base having an LED chip mounted thereon, an encapsulation member formed by a light-transmittable resin to encapsulate the LED chip, and a housing formed to expose a top portion of the encapsulation member and to encompass a side surface of the encapsulation member, wherein the encapsulation member is formed by a molding process using a mold to have a top surface of a desired shape. At this time, the top portion of the encapsulation member may be formed in the shape of a plane or lens. Here, it is preferable that the molding process using a mold be a transfer molding process.

Preferably, the housing may be formed by a transfer molding process before or after the encapsulation member is formed. Further, the housing is light-transmittable. More preferably, the housing may be a semitransparent housing, which includes a diffuser for adjusting the transparency of the housing and is used as a reflector.

An LED package according to another aspect of the present invention comprises a base having an LED chip mounted thereon, an encapsulation member formed by a light-transmittable resin to encapsulate the LED chip, and a housing formed to expose a top portion of the encapsulation member and to encompass a side surface of the encapsulation member, wherein the housing is light-transmittable. At this time, the housing and the encapsulation member are preferably formed by a transfer molding process.

A method for fabricating an LED package according to an aspect of the present invention comprises the steps of mounting an LED chip on a base, forming a housing for supporting the base, and forming an light-transmittable encapsulation member for encapsulating the LED chip, the housing encompassing a side surface of the encapsulation member, wherein the step of forming the encapsulation member comprises the step of molding the encapsulation member using a mold so that the encapsulation member has a predetermined, desired top surface. Preferably, the molding process is a transfer molding process.

A method for fabricating an LED package according to another aspect of the present invention comprises the steps of: mounting an LED chip on a base, forming a light-transmittable encapsulation member for encapsulating the LED chip and supporting the base, and forming a housing for encompassing a side surface of the encapsulation member, wherein the step of forming the encapsulation member comprises the step of molding the encapsulation member using a mold. Preferably, the molding process is a transfer molding process.

In the step of forming the housing, a mixing ratio of the diffuser is preferably adjusted to adjust a viewing angle.

Further, if the transfer molding is repeated twice or more in the step of forming the housing as described above, a structure in which a plurality of the housings are laminated with each other is made. The transfer molding is referred to as multiple transfer molding. Further, if the transfer molding is repeated twice or more in the step of forming the encapsulation member as described above, a structure in which a plurality of the encapsulation members are laminated with each other is made. The transfer molding is referred to as multiple transfer molding.

According to an embodiment of the present invention, a control range of a light viewing angle of an LED package is enlarged, and the LED package can be easily designed to have the desired light viewing angle. Further, it is possible to solve various problems which may be caused by a shape of an encapsulation member, such as a hot spot phenomenon, in which a contact portion between a light guide plate and the encapsulation member of the LED package is excessively bright when the LED package is used as a backlight, or the degradation of the light emitting efficiency caused by the concave shape of the encapsulation member. Further, according to an embodiment of the present invention, since the encapsulation member and the housing are formed by a transfer molding process, a molding equipment may be used as it is while a mold may be replaced with another to form both the encapsulation member and the housing, which is more economical than the prior art. Furthermore, unlike the prior art in which the encapsulation member is separately formed in a dotting manner, only one mold having a plurality of spaces for forming an encapsulation member is used, and the liquefied resin is filled in the spaces at a time and then is rapidly cured according to one embodiment of the present invention. Thus, a plurality of LED packages can be quickly fabricated, thereby largely enhancing the productivity of LED packages.

DETAILED DESCRIPTION OF THE ILLUSTRATED EMBODIMENTS

Figure 1:
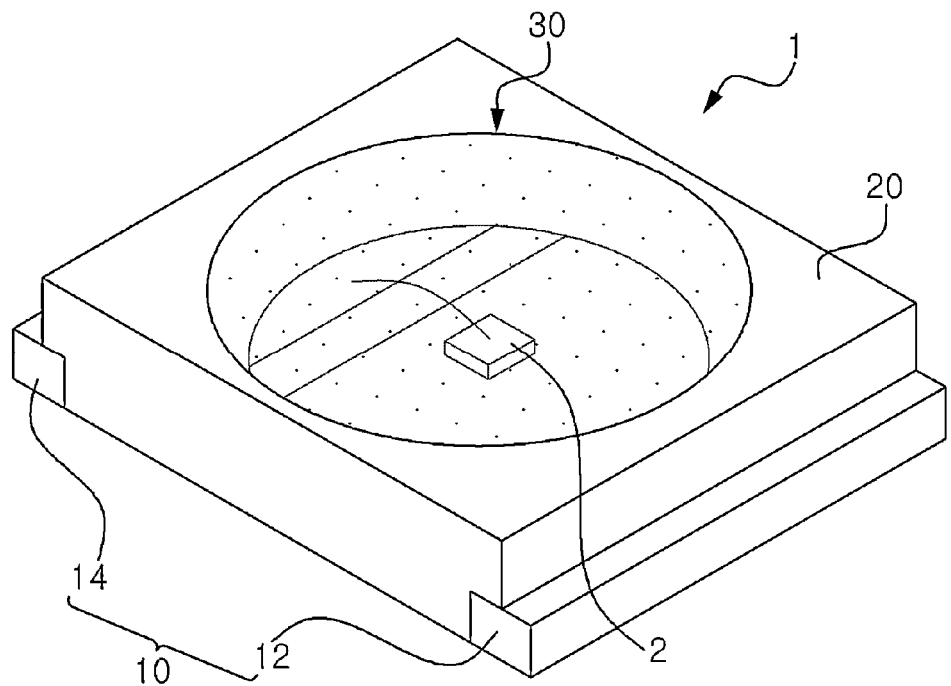
FIG. 1 is a perspective view illustrating an LED package according to an embodiment of the present invention.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 2:
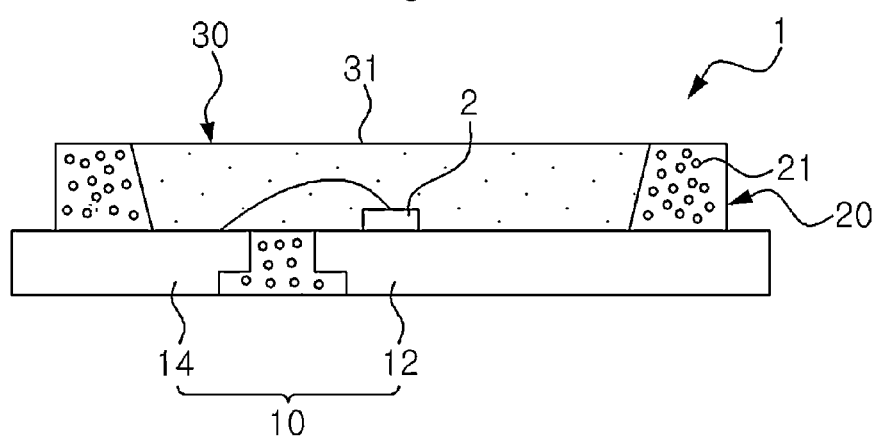
FIG. 2 is a sectional view illustrating the LED package according to the embodiment of the present invention.

FIG. 1 is a perspective view illustrating an LED package according to an embodiment of the present invention, and FIG. 2 is a sectional view illustrating the LED package according to the embodiment of the present invention.

Referring to FIGS. 1 and 2, an LED package 1 according to this embodiment includes a lead frame 10 having a first lead terminal 12 and a second lead terminal 14, wherein the lead frame 10 functions as a base on which a LED chip 2 is mounted. The lead frame 10 is formed by cutting a large patterned thin metal plate in order to provide the first lead terminal 12 and the second lead terminal 14 which are spaced apart from each other. At this time, a plurality of the lead frames 10 for a plurality of the LED packages may be obtained from the thin metal plate. Further, the cutting process of the lead frame 10 is performed after a housing 20 and an encapsulation member 30, which will be described later, are formed.

The LED chip 2 is die-attached onto a top surface of the first lead terminal 12 of the lead frame 10, and the LED chip 2 on the first lead terminal 12 is electrically connected to the second lead terminal 14 via a bonding wire.

Further, the LED package 1 of this embodiment includes the housing 20 and the encapsulation member 30. The encapsulation member 30 is formed of a light-transmittable material and encapsulates the LED chip 2 to protect the LED chip 2 and the like. The housing 20 may function as a reflector and is configured to encompass a side surface of the encapsulation member 30 and to expose a top portion of the encapsulation member 30. In this embodiment, the housing 20 serves to support the lead frame 10, i.e., the first lead terminal 12 and the second lead terminal 14.

As will be described in detail below, the encapsulation member 30 and the housing 20 are formed by a transfer molding process. In this embodiment, the housing 20 is formed of an epoxy molding compound (EMC) by the transfer molding process in order to support the lead frame 10 before the encapsulation member 30 is formed. At this time, a bottom surface of the housing 20 is substantially flush with that of the lead frame 10, so that the first and second lead terminals 12 and 14 of the lead frame 10 may be exposed to the outside in the neighborhood of the bottom surface of the housing 20 even without a bending process.

In order to function as the reflector, the housing 20 is formed of the EMC into which a white, milky and/or light gray diffuser 21 (as shown in FIG. 2) such as $TiO_2$, $SiO_2$, ZnO or $Y_2O_3$ is mixed. Therefore, the housing 20 comprises the diffuser 21, so that the transparency of the housing 20 and the viewing angle of the LED package 1 can be adjusted depending on the content of the diffuser 21 mixed into the transparent EMC.

Figure 3:
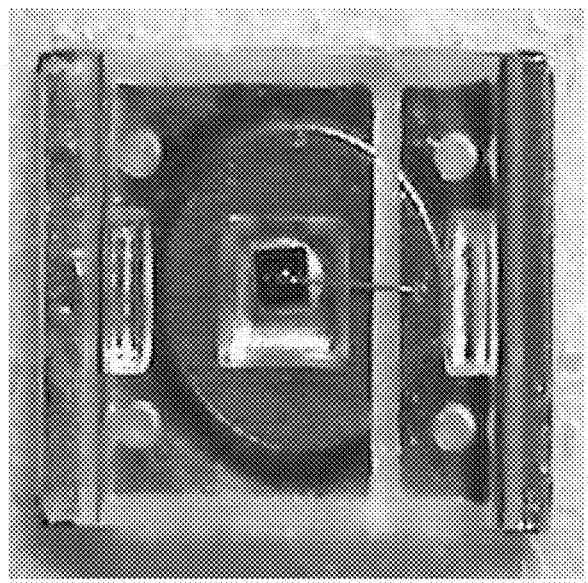
FIGS. 3 to 5 are photographs showing LED packages, in which the transparency of a light-transmittable housing is adjusted depending on the content of a diffuser included therein.
Figure 4:
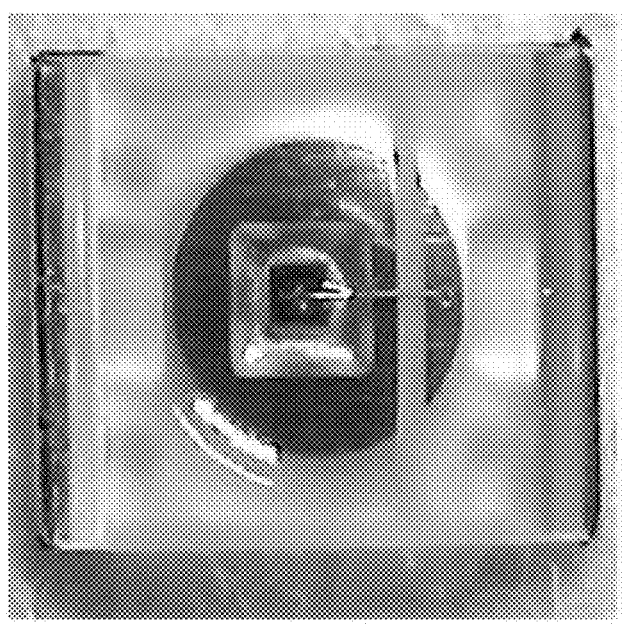
Figure 5:
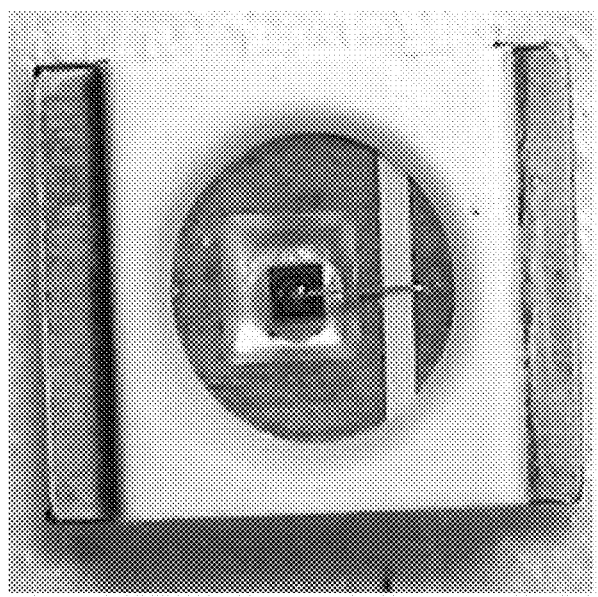

FIGS. 3 to 5 are photographs of practical products of LED packages in which the transparency of the housing 20 varies depending on the content of the diffuser 21. The LED package shown in FIG. 3 includes a housing formed of a transparent EMC without $TiO_2$ diffuser. The housing is substantially transparent, and the amount of light emitted through the housing is large so that the viewing angle is relatively broad. The LED package shown in FIG. 4 includes the housing formed of an EMC in which 0.3% of the $TiO_2$ diffuser is mixed. The housing is semitransparent, and the amount of the light reflected from the inner surface of the housing toward the encapsulation member is such that the viewing angle of the LED package shown in FIG. 4 is narrower than that of the LED package shown in FIG. 3. The LED package shown in FIG. 5 includes a housing formed of an EMC in which 3% of the $TiO_2$ diffuser is mixed. The transparency of the housing is therefore smaller, and the LED package may emit the light with a narrow light viewing angle of about 120 degrees which is appropriate for a backlight unit.

Referring back to FIGS. 1 and 2, the housing 20 is shaped to encompass the side surface of the encapsulation member 30 on the whole and to allow the top portion of the encapsulation member 30 to be exposed. Since the housing 20 for supporting the lead frame 10 is formed prior to the encapsulation member 30 in this embodiment, the housing 20 is configured to include a cavity for defining the position of the encapsulation member 30 which will be subsequently formed. In this embodiment, the encapsulation member 30, into which a light-transmittable resin such as epoxy or silicone is molded, is formed by a molding process using a mold, particularly, by a transfer molding process in order to obtain a desired shape.

It is preferable that the encapsulation member 30 is formed by a molding process using a mold, particularly, by a transfer molding process, wherein the molding process using a mold allows the shape of a top surface 31, through which the light is primarily emitted, to be formed as desired. For example, the transfer molding makes it possible to form the encapsulation member 30 having a planar top surface 31. When a liquefied resin is injected into the cavity of the housing 20 to form the encapsulation member 30, the surface tension makes it impossible to obtain the planar shape as desired above. However, it is noted that the present invention does not completely exclude the injection of the liquefied resin into the cavity in a dotting manner.

A phosphor which is excited by light having a specific wavelength to emit light having a different wavelength may be contained in the encapsulation member 30.

The shape of the encapsulation member 30 is not limited to the planar shape, but various encapsulation members 30 having hemispherically convex or concave lens shapes or various lens shapes having Fresnel patterns may be formed by a molding process using a mold, such as a transfer molding process. Fresnel pattern contributes to enlarging the viewing angle of its corresponding lens.

Figure 6:
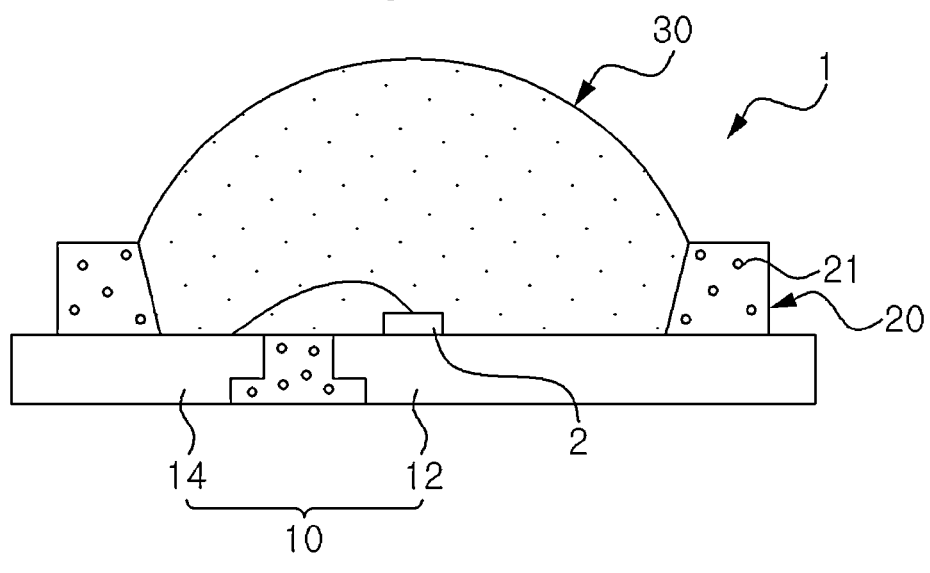
FIGS. 6(a) and 6(b) are sectional views illustrating LED packages according to other embodiments of the present invention.
Figure 6:
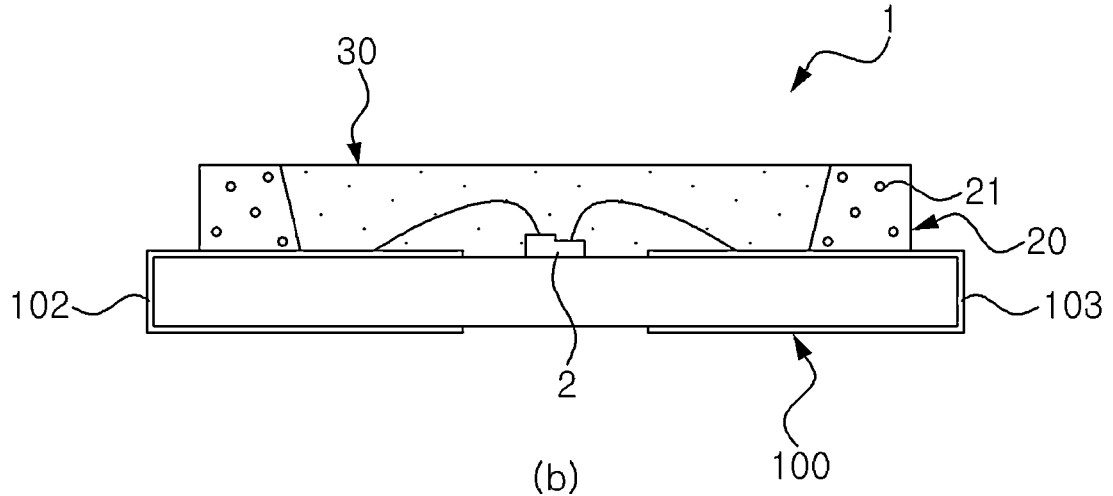

FIG. 6(*a*) shows the configuration of the LED package 1 according to another embodiment of the present invention, wherein a lens type encapsulation member 30 having a hemispheric top surface, is formed by a transfer molding process.

Meanwhile, instead of the lead frame 10 as described in the previous embodiment, another base on which the LED chip 2 is mounted may be used. For example, in the LED package 1 shown in FIG. 6(*b*), a printed circuit board (PCB) 100 is used as the base on which the LED chip 2 is mounted. Referring to FIG. 6(*b*), the LED chip 2 is mounted on the top central region of the PCB 100. Further, the top surface of the PCB 100 is provided with first and second electrode patterns 102 and 103 which are electrically connected to the LED chip 2 by bonding wires, wherein the first and second electrode patterns 102 and 103 may be formed by an electroplating process. In this embodiment, both the encapsulation member 30 and the housing 20 are formed by a transfer molding process.

Although it has been described above that the housing 20 is first transfer-molded and the encapsulation member 30 is then transfer-molded as described above, it may be considered that the encapsulation member 30 is first transfer-molded and the housing 20 is then transfer-molded. It is easy to separately transfer-mold the housing 20 and the encapsulation member 30 regardless of their sequential order particularly when the housing 20 and the encapsulation member 30 are formed of thermosetting plastic such as epoxy or silicone. This is because a portion to be formed first is not influenced by the melting temperature of the other portion to be formed later. Further, it may be considered that a housing 20 having a cavity is formed by a transfer molding process and then a liquefied resin is injected into the cavity in a dotting manner to form the encapsulation member 30.

If the transfer molding process is used, it is possible to make an integrated housing 20 in which a plurality of partial housings are laminated by repeating the transfer molding twice or more in order to form the integrated housing 20. Further, if the transfer molding process is used, it is possible to make an integrated encapsulation member 30 in which a plurality of partial encapsulation members are laminated by repeating the transfer molding twice or more. The transfer molding process repeated twice or more as described above is referred to as multiple transfer molding.

Now, various embodiments of a method for fabricating the LED package as described above will be described.

Figure 7:
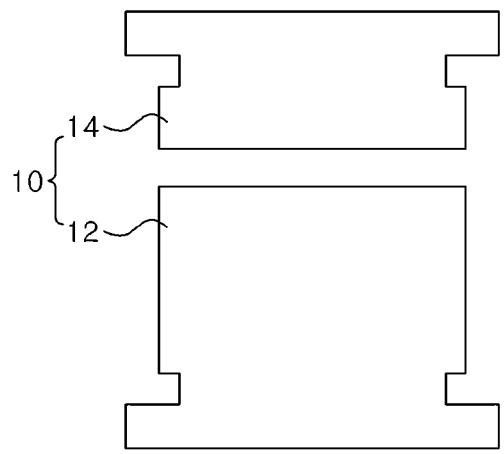
FIG. 7 shows views illustrating a method of fabricating an LED package according to an embodiment of the present invention.
Figure 7:
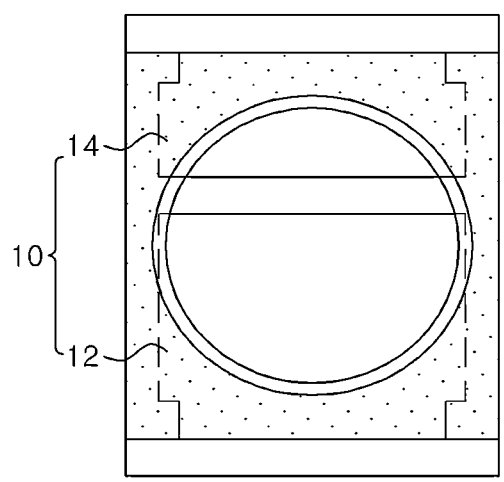
Figure 7:
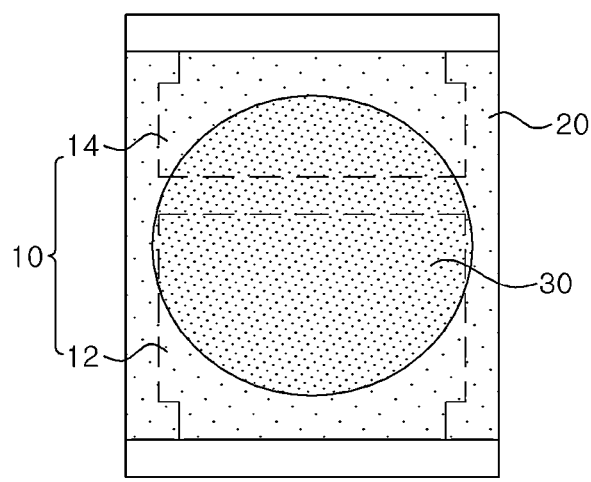

FIG. 7 shows plan views illustrating a method for fabricating an LED package according to an embodiment of the present invention on a process-by-process basis.

First, as shown in FIG. 7(*a*), the lead frame 10 which includes the first and second lead terminals 12 and 14 is prepared. At this time, although the LED chip is mounted on the lead frame 10 and the bonding wire is connected to the lead frame 10, the LED chip and the bonding wire will be omitted from the drawings for the convenience of illustration. Further, although the lead frame 10 is no more than a portion of a patterned thin metal plate including a plurality of lead frames which have not been cut yet in the practical method for fabricating the LED package, only one lead frame 10 which has been previously cut is shown for the convenience of illustration and description.

Further, as shown in FIG. 7(a), the first and second lead terminals 12 and 14 each comprise a pair of notches disposed adjacent to a terminal end of the LED package. The notches extend further into the first and second lead terminals 12 and 14 than portions of the respective first and second lead terminals 12 and 14 on either side of the notches.

Then, as shown in FIG. 7(b), the housing 20 is formed on the lead frame 10 by a transfer molding process. The housing 20 causes the first and second lead terminals 12 and 14 to be exposed upwards through the cavity of the housing 20 itself. In addition, the housing 20 formed on the lead frame 10 supports the lead frame 10. At this time, it is preferable that a molding material used for the transfer molding of the housing 20 is a tablet-type solid EMC which is made by adding a diffuser to a transparent powder-type EMC. However, a light-transmittable resin such as silicone may be used without using epoxy as the primary component.

Then, as shown in FIG. 7(c), the encapsulation member 30 of epoxy or silicone for encapsulating the LED chip (not shown in FIG. 7) is formed inside of the cavity of the housing 20 by a transfer molding process. In the transfer molding of the encapsulation member 30, a solid EMC (in particular, a tablet-type solid EMC) is used. Another molding process using a mold may be considered, and for example, the encapsulation member 30 may be formed of a liquefied epoxy or silicone by an injection molding process. Further, the shape of the encapsulation member 30 molded by means of a mold is previously defined by the previously designed mold, and the shape of the encapsulation member 30 is preferably shaped as a plane or lens. At this time, since the encapsulation member 30 is formed in the cavity of the housing 20, the housing 20 is shaped to surround the side surface of the encapsulation member 30 on the whole.

FIG. 8(a) is a view illustrating a transfer molding process for the housing 20, and FIG. 8(b) is a view illustrating a transfer molding process of the encapsulation member 30.

Referring to FIG. 8(a), a resin under the high temperature and pressure is injected into a mold M1 for forming the housing, which includes an injection hole I, so that the mold M1 is filled with the resin, and then, the housing 20 is formed by curing the filled resin. At this time, a gate G (see FIG. 8(b)) to be used for the transfer molding of the encapsulation member 30 which will be performed later has been previously formed. Further, instead of the gate G, a groove which has been previously formed on an upper end of the cavity of the housing 20 may be used as a resin injection gate.

Referring to FIG. 8(b), the resin is injected into a space defined by the cavity of the housing 20 and the mold M2 through an injection hole I of a mold M2 for forming the encapsulation member and the gate G which has been previously formed in the housing 20. At this time, the shape of the top surface of the encapsulation member is defined, for example, in the shape of a plane or lens by means of the mold M2.

Figure 8:
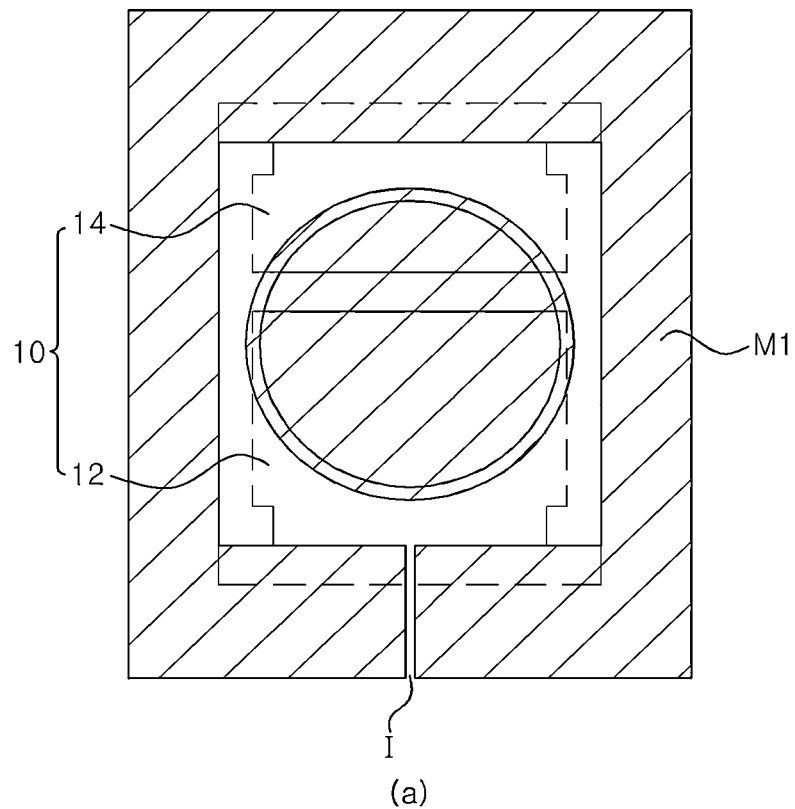
FIG. 8 shows views illustrating a transfer molding process for a housing and an encapsulation member in the method of fabricating an LED package as shown in FIG. 7.
Figure 8:
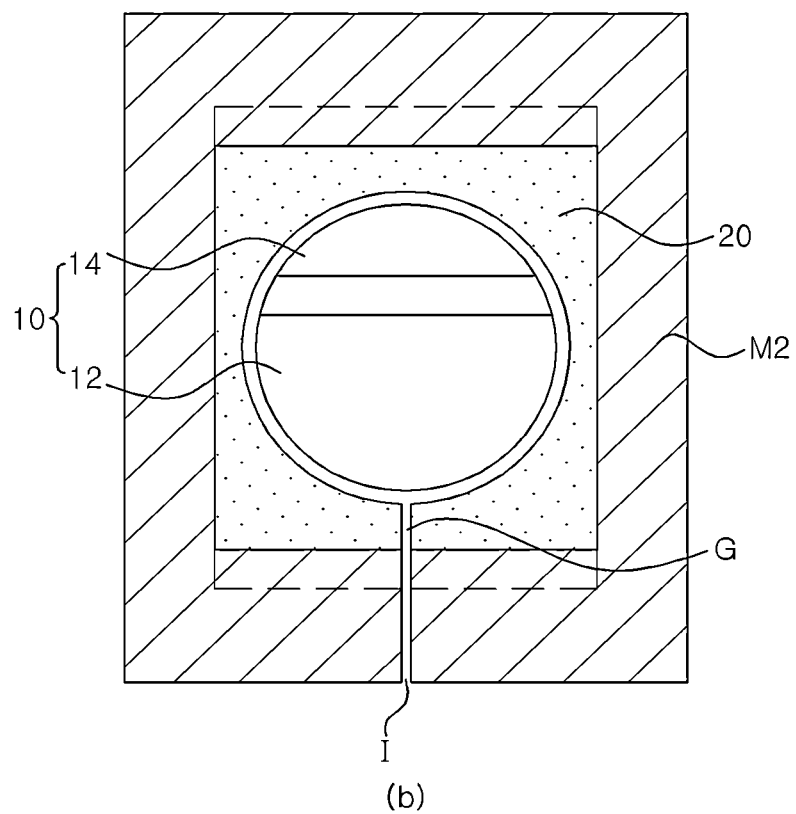

Although the processes shown in FIGS. 7 and 8 are accomplished for the lead frame 10, they may be accomplished for another kind of base such as a PCB instead of the lead frame 10. Except when another kind of base is used instead of the lead frame 10, the processes shown in FIGS. 7 and 8 may be applied as they are without further modification.

Figure 9:
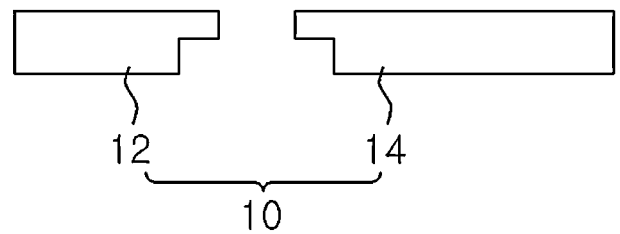
FIG. 9 shows views illustrating a method of fabricating an LED package according to another embodiment of the present invention.
Figure 9:
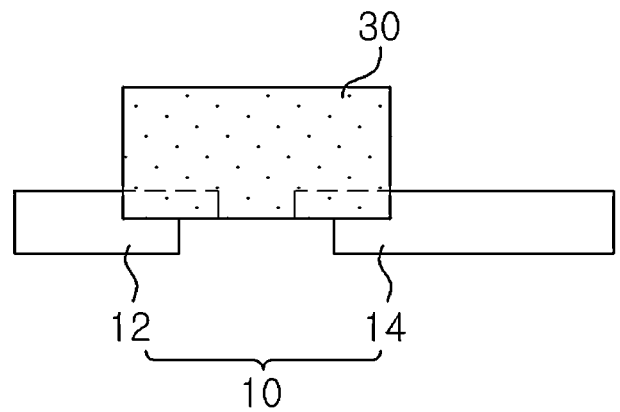
Figure 9:
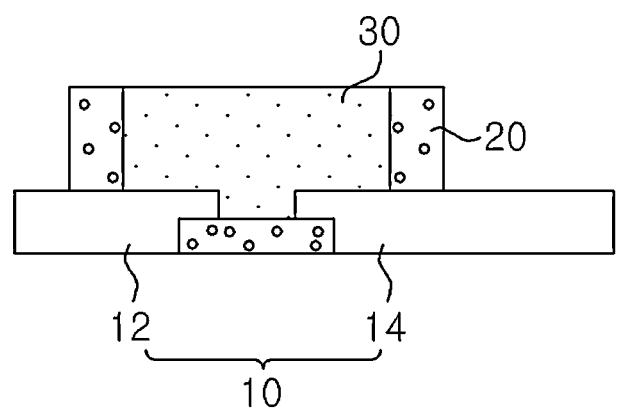

FIG. 9 shows plan views illustrating a method for fabricating an LED package according to another embodiment of the present invention on a process-by-process basis.

First, the lead frame 10 which comprises the first and second lead terminals 12 and 14 is prepared as shown in FIG. 9(a). At this time, although the LED chip is mounted on the lead frame 10 and the bonding wire is connected to the lead frame 10, the LED chip and the bonding wire will be omitted from the drawings for the convenience of illustration. Further, although the lead frame 10 is no more than a portion of a patterned thin metal plate including a plurality of lead frames which have not been cut yet in the practical method for fabricating the LED package, only one lead frame 10 which has been previously cut is shown for the convenience of illustration and description.

Then, as shown in FIG. 9(b), the encapsulation member 30 for encapsulating the LED chip (not shown in FIG. 9) is formed prior to the formation of the housing 20. The encapsulation member 30 is formed to support the lead frame 10 which comprises the first and second lead terminals 12 and 14. The encapsulation member 30 is formed in the shape predetermined by the mold for transfer molding. A solid EMC (in particular, a tablet-type solid EMC) may be used in the transfer molding process of the encapsulation member 30, wherein the solid EMC may include a phosphor. Alternatively, instead of the transfer molding, injection molding may be used to form the encapsulation member 30, wherein a liquefied epoxy resin or a liquefied silicone resin is directly injected into the mold in the injection molding process. The liquefied epoxy resin or the liquefied silicone resin may include a phosphor.

Then, as shown in FIG. 9(c), the housing 20 is formed for surrounding the side surface of the encapsulation member 30. At this time, the transfer molding may also be used. Either a tablet-type solid EMC which is made by adding a diffuser to a transparent powder type EMC or a liquefied epoxy or silicone may be used as the molding material used for the transfer molding of the housing 20.

Figure 10:
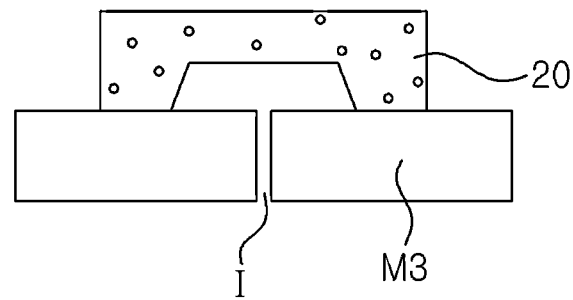
FIG. 10 is a view illustrating a transfer molding process for an encapsulation member according to a further embodiment of the present invention, wherein the transfer molding process is appropriate to form an encapsulation member of an LED package having a thin housing.

FIG. 10 is a view illustrating a transfer molding process in which a resin is directly injected into a cavity of the turned-over housing 20 according to a further embodiment of the present invention. A mold M3 causes the cavity of the housing 20 to be closed. Further, the mold M3 has an injection hole I directly connected to the cavity of the housing 20. The transfer molding process may be preferably used to form the encapsulation member, for example, in a side view type LED package in which the thickness of the housing 20 is relatively thin so that the housing 20 may be easily broken.

Figure 11:
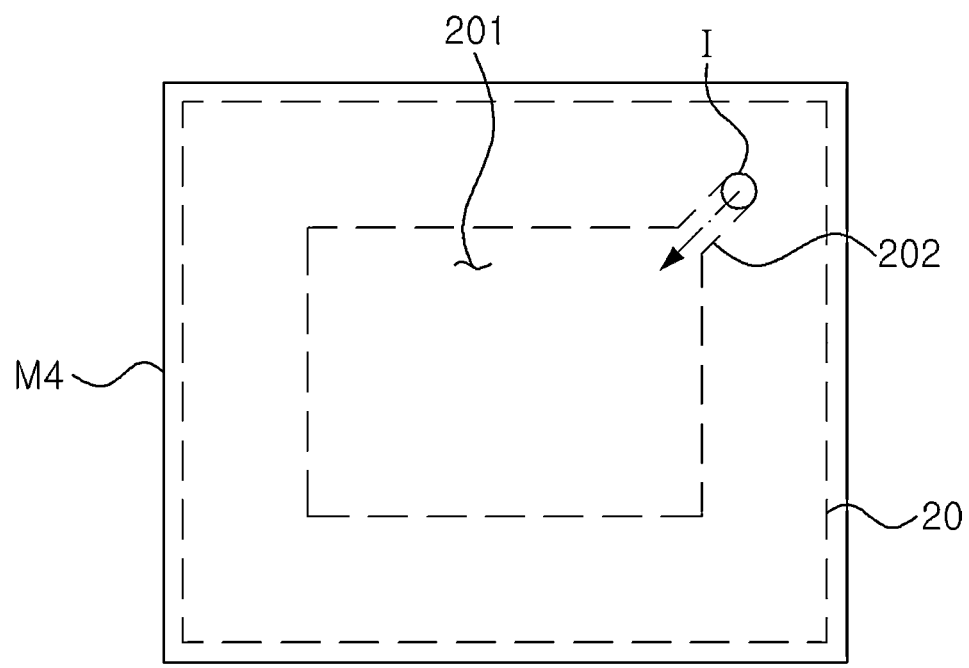
FIG. 11 is a view illustrating a transfer molding process for an encapsulation member according to a still further embodiment of the present invention.

FIG. 11 is a view illustrating a transfer molding process for an encapsulation member according to a still further embodiment of the present invention. Referring to FIG. 11, a cavity 201 in which an LED chip is received is formed in the housing 20, and the cavity 201 is closed by a plate-shaped mold M4 which is positioned on the top side of the cavity. In addition, a groove 202 is formed at an edge of the cavity 201 (and more particularly, adjacent to a vertex of the cavity). The groove 202 conforms to an injection hole I which is formed in the mold M4 with the cavity 201 closed by the mold M4, so that an injection passage for a resin into the cavity 201 may be compartmentally formed.

If the resin is injected through the injection hole I and the groove 202 and then the injected resin is cured, the encapsulation member 30 is formed in the cavity 201. The upper shape of the encapsulation member 30 is defined by the mold M4. For example, if the mold M4 having a planar surface for closing the cavity 201 is used, the encapsulation member 30 whose top surface is plane is formed. Depending on the surface shape of the mold M4 for closing the encapsulation member 30, lenses having various shapes, i.e., a spherical lens, a Fresnel lens or other shaped lens, may be formed. Patterns, roughness and/or unevenness on a surface of the lens may be regular or irregular.

Although not drawn, upper and lower molds for receiving and supporting a housing or an LED package including the housing 20 and a mold M4 used for the molding may be used to molding the encapsulation member while the upper and lower molds and the mold M4 are assembled as a set.

Figure 12:
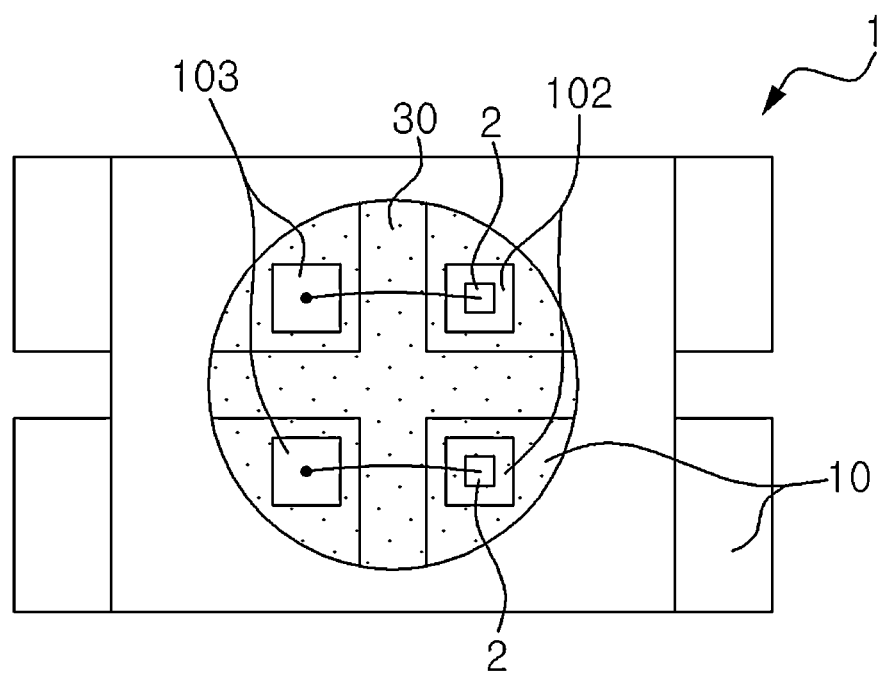
FIG. 12 is a view illustrating an LED package according to a still further embodiment of the present invention.

FIG. 12 is a plan view illustrating an LED package 1 according to a still further embodiment of the present invention. Referring to FIG. 12, a plurality of recesses 102 for receiving the LED chip 2 are formed on the base 10, which may comprise a lead frame, a PCB or other substrates. In addition, another plurality of recesses 103 for receiving bonding pads (or wire balls) for the bonding wires are further formed on the base 10. The recesses 102 and prevent the LED packages 1 from not being slimmed (or compacted) by increasing the thickness of the LED chip 2 or the bonding pads (or wire balls). In particular, the recess 102, in which the LED chip 2 is received, may be filled with a resin (preferably, a silicone resin) including an anti-deterioration material and/or a phosphor. In addition, the recesses 102 and 103 may contribute to increasing the adhesion between the encapsulation member 30 and the lead frame 10. In order to increase the adhesion, it may be considered that a plurality of recesses, which are in contact with the encapsulation member 30 to increase the adhesion, may be formed on the base 10 regardless of the position of the LED chip 1 and the bonding pads.

The present invention is not limited to the aforementioned embodiments but may be applied to all kinds of LED packages having an encapsulation member and a housing, for example, a side view type LED package, a PCB type or chip LED package, a lamp type LED package or a high-flux type LED package as well as a top type LED package.

What is claimed is:

1. A light emitting diode (LED) package, comprising:
   a base comprising a first lead terminal and a second lead terminal, both of the first lead terminal and the second lead terminal comprising a first part, a second part, and a third part, each of the first part, the second part, and the third part having a different width, the width of the second part being narrower than the width of the first part, the third part being between the first part and the second part, and the width of the third part being narrower than the width of the second part;
   an LED chip disposed on the base;
   a housing comprising a first portion disposed between the first lead terminal and the second lead terminal, and a second portion disposed on the first portion and the base, the housing comprising a cavity in which the LED chip is disposed; and
   an encapsulation member comprising a side surface contacting the housing,
   wherein the first portion comprises:
     an interfacial portion disposed in a gap between the first lead terminal and the second lead terminal; and
     side portions connected to the interfacial portion and partially covering side surfaces of the first and second lead terminals,
   wherein a length of a side surface of the second portion of the housing is greater than a length of the side portions of the first portion of the housing,
   wherein the first lead terminal and the second lead terminal each comprise an upper surface and a bottom surface opposite the upper surface, and have an unbent form, respectively,
   wherein the bottom surface is exposed to the outside of the LED package,
   wherein the first lead terminal and the second lead terminal comprise a first protrusion and a second protrusion, respectively, exposed outside of the housing,
   wherein the width of the first part is the same as a width of the first protrusion and a width of the second protrusion,
   wherein the bottom surfaces of the first and second lead terminals are flush with a bottom surface of the first portion of the housing,
   wherein the side portions of the first portion of the housing are flush with portions of side surfaces of the first and second lead terminals,
   wherein portions of the upper surfaces of the first and second lead terminals are exposed outside of the housing, respectively, and
   wherein each of the portions of the upper surfaces of the first and second lead terminals exposed outside of the housing has a constant width the same as that of the housing in a direction crossing the side portions of the first portion of the housing.

2. The LED package of claim 1, wherein the LED chip is disposed on the first lead terminal, and electrically connected to the second lead terminal.

3. The LED package of claim 1, wherein the bottom surface of the housing is formed to be substantially flush with the second surfaces of the first lead terminal and the second lead terminal using a transfer molding process.

4. The LED package of claim 1, wherein the housing comprises an epoxy molding compound (EMC).

5. The LED package of claim 4, wherein the housing further comprises a diffuser.

6. The LED package of claim 5, wherein the diffuser comprises at least one selected from the group consisting of $TiO_2$, $SiO_2$, $ZnO$, $Y_2O_3$, and a mixture thereof.

7. The LED package of claim 1, wherein the first lead terminal and the second lead terminal comprise a flat-plate form.

8. The LED package of claim 1, wherein the encapsulation member comprises a planar top surface.

9. The LED package of claim 1, wherein the encapsulation member comprises a convex top surface.

10. The LED package of claim 1, wherein the first lead terminal is spaced apart from the second lead terminal, and
    wherein a first distance separating the first surface of the first and second lead terminals is smaller than second distance separating the bottom surface of the first and second lead terminals.

11. The LED package of claim 10, wherein the upper surface of the first and second lead terminals each comprises a larger surface area than the bottom surface of the first and second lead terminals, respectively.

12. The LED package of claim 11, wherein the width of base comprises the same width as the housing, and the length of the base is longer than the length of the housing.

13. The LED package of claim 12, wherein the base comprises a first width and a second width,
    wherein the first width is the same as the width of the housing, and wherein the second width is less than the first width of the base.

14. The LED package of claim 13, wherein the first lead terminal and the second lead terminal each comprise a pair of notches disposed adjacent to a surface comprising a terminal end of the LED package, and wherein side surfaces of the notches contact the housing.

* * * * *